US011829545B2

United States Patent
Xu et al.

(10) Patent No.: US 11,829,545 B2
(45) Date of Patent: Nov. 28, 2023

(54) DISPLAY APPARATUS, TOUCH-CONTROL DISPLAY PANEL AND MANUFACTURING METHOD THEREFOR, AND TOUCH-CONTROL PANEL

(71) Applicants: Hefei Xinsheng Optoelectronics Technology Co., Ltd., Anhui (CN); BOE Technology Group Co., Ltd., Beijing (CN)

(72) Inventors: Jiawei Xu, Beijing (CN); Wenjin Fan, Beijing (CN); Wei Zhang, Beijing (CN); Zhao Dong, Beijing (CN); Bisheng Li, Beijing (CN); Baoran Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/911,421

(22) PCT Filed: Nov. 19, 2021

(86) PCT No.: PCT/CN2021/131946
§ 371 (c)(1),
(2) Date: Sep. 14, 2022

(87) PCT Pub. No.: WO2022/156346
PCT Pub. Date: Jul. 28, 2022

(65) Prior Publication Data
US 2023/0102480 A1 Mar. 30, 2023

(30) Foreign Application Priority Data
Jan. 25, 2021 (CN) .......................... 202110096180.8

(51) Int. Cl.
*G06F 3/041* (2006.01)
*G06F 3/044* (2006.01)
*H10K 59/40* (2023.01)

(52) U.S. Cl.
CPC .......... *G06F 3/0412* (2013.01); *G06F 3/0443* (2019.05); *G06F 3/0446* (2019.05);
(Continued)

(58) Field of Classification Search
CPC .. G06F 3/0412; G06F 3/04164; G06F 3/0443; G06F 3/0446; G06F 2203/04103;
(Continued)

(56) References Cited

U.S. PATENT DOCUMENTS 9,018,716 B1 * 4/2015 Chou .................... H01L 23/60
257/417
9,921,682 B2 * 3/2018 Sato ........................ G06F 3/044
(Continued)

FOREIGN PATENT DOCUMENTS

| CN | 203204586 U | 9/2013 |
| CN | 105824448 A | 8/2016 |

(Continued)

OTHER PUBLICATIONS

International Search Report and Written Opinion dated Feb. 15, 2022, in corresponding PCT/CN2021/131946, 3 pages.
(Continued)

*Primary Examiner* — Amy Onyekaba
(74) *Attorney, Agent, or Firm* — XSENSUS LLP

(57) ABSTRACT

The present disclosure relates to a touch-control panel, including a touch-control layer arranged on the side of a display substrate having a display area and a peripheral area. The touch-control layer includes a touch-control electrode at least partially located in the display area and a peripheral wiring located in the peripheral area; the touch-control
(Continued)

electrode includes a first touch-control electrode and a second touch-control electrode; the peripheral wiring includes a first wiring, a second wiring, a first shielding line and a second shielding line; the first shielding line is arranged outside the first wiring, the second wiring is arranged outside the first shielding line, and the second shielding line is arranged outside the second wiring.

20 Claims, 3 Drawing Sheets

(52) U.S. Cl.
CPC ......... *G06F 3/04164* (2019.05); *H10K 59/40* (2023.02); *G06F 2203/04103* (2013.01); *G06F 2203/04107* (2013.01)

(58) Field of Classification Search
CPC . G06F 2203/04107; G06F 2203/04111; H10K 59/40; H10K 59/126; H10K 59/131
See application file for complete search history.

(56) References Cited

U.S. PATENT DOCUMENTS

| | | | | |
|---|---|---|---|---|
| 11,144,168 | B1* | 10/2021 | Lin | ........................ G06F 3/0448 |
| 2013/0093696 | A1* | 4/2013 | Huang | ................... G06F 3/0445 |
| | | | | 345/173 |
| 2013/0120312 | A1 | 5/2013 | Takahashi et al. | |
| 2014/0176825 | A1* | 6/2014 | Lee | ........................ G06F 3/0412 |
| | | | | 349/12 |
| 2017/0090652 | A1 | 3/2017 | Sato et al. | |
| 2019/0064972 | A1* | 2/2019 | Ryu | ........................ G06F 3/0446 |
| 2021/0026474 | A1* | 1/2021 | Yi | ........................ G06F 3/04164 |

FOREIGN PATENT DOCUMENTS

| | | | | |
|---|---|---|---|---|
| CN | 205608688 U | | 9/2016 | |
| CN | 110389686 A | * | 10/2019 | ............. G06F 3/041 |
| CN | 111399695 A | | 7/2020 | |
| CN | 211124000 U | * | 7/2020 | |
| CN | 211124000 U | | 7/2020 | |
| CN | 11651089 A | | 9/2020 | |
| CN | 111708450 A | | 9/2020 | |
| CN | 211554547 U | | 9/2020 | |
| CN | 211742081 U | | 10/2020 | |
| CN | 214409944 U | | 10/2021 | |
| EP | 2246925 A2 | | 11/2010 | |
| WO | 2020/204434 A1 | | 10/2020 | |

OTHER PUBLICATIONS

J.J. Paul Gagne, "Silver Migration Model for Ag—Au—Pd Conductors", IEEE Transactions on Components, Hybrids, and Manufacturing Technology, vol. CHMT-5, No. 4, Dec. 1982, pp. 402-407.
Yilin Zhou et al., "Life Model of the Electrochemical Migration Failure of Printed Circuit Boards Under NaCl Solution", IEEE Transactions on Device and Materials Reliability, vol. 19, No. 4, Dec. 2019, pp. 622-629.

* cited by examiner

S110 — Form a display substrate having a display area and a peripheral area outside the display area S120 — Form a touch layer on a side of the display substrate

DISPLAY APPARATUS, TOUCH-CONTROL DISPLAY PANEL AND MANUFACTURING METHOD THEREFOR, AND TOUCH-CONTROL PANEL

CROSS-REFERENCE

The present application is the 371 application of PCT Application No. PCT/CN2021/131946, filed on Nov. 19, 2021, which is based upon and claims the priority to the Chinese Patent Application NO. 202110096180.8, entitled "DISPLAY DEVICE, TOUCH DISPLAY PANEL AND MANUFACTURING METHOD THEREFOR, AND TOUCH PANEL", filed on Jan. 25, 2021, the entire contents of which are hereby incorporated by reference.

TECHNICAL FIELD

The present disclosure relates to the field of touch technologies, and in particular, to a display device, a touch display panel, a manufacturing method for the touch display panel, and a touch panel.

BACKGROUND

Touch display panels have been widely used in terminal devices such as mobile phones, wearable devices, and tablet computers for touch operations, so as to realize human-computer interaction.

It should be noted that the information disclosed in the Background section above is only for enhancing the understanding of the background of the present disclosure, and thus may include information that does not constitute prior art known to those of ordinary skill in the art.

SUMMARY

The present disclosure provides a display device, a touch display panel, a manufacturing method for the touch display panel, and a touch panel.

According to an aspect of the present disclosure, there is provided a touch panel, and the touch panel includes:
a touch layer, disposed on a side of a display substrate, wherein the display substrate has a display area and a peripheral area outside the display area; the touch layer includes a touch electrode and a peripheral trace, and the touch electrode is at least partially located in the display area, the peripheral trace is located in the peripheral area; the touch electrode includes a first touch electrode and a second touch electrode, the peripheral trace includes a first trace, a second trace, a first shielding line and a second shielding line; the first trace is disposed outside the display area and is coupled with the first touch electrode, the first shielding line is disposed outside the first trace, the second trace is disposed outside the first shielding line and is coupled with the second touch electrode, and the second shielding line is disposed outside the second trace;
a width of at least a partial area of a gap between the first shielding line and the first trace is a first spacing, a width of at least a partial area of a gap between the second trace and the first shielding line is a second spacing, and a width of at least a partial area of a gap between the second shielding line and the second trace is a third spacing; and
the third spacing is greater than the first spacing and greater than the second spacing.

According to an aspect of the present disclosure, there is provided a touch display panel, and the touch display panel includes:
a display substrate, having a display area and a peripheral area outside the display area; and
the touch panel according to any one of the above embodiments, disposed on a side of the display substrate.

According to an aspect of the present disclosure, there is provided a manufacturing method for a touch display panel, including:
forming a display substrate having a display area and a peripheral area outside the display area;
forming a touch layer on a side of the display substrate, wherein the touch layer includes a touch electrode and a peripheral trace, and the touch electrode is at least partially located in the display area, the peripheral trace is located in the peripheral area; the touch electrode includes a first touch electrode and a second touch electrode, the peripheral trace includes a first trace, a second trace, a first shielding line and a second shielding line; the first trace is disposed outside the display area and is coupled with the first touch electrode, the first shielding line is disposed outside the first trace, the second trace is disposed outside the first shielding line and is coupled with the second touch electrode, and the second shielding line is disposed outside the second trace;
a width of at least a partial area of a gap between the first shielding line and the first trace is a first spacing, a width of at least a partial area of a gap between the second trace and the first shielding line is a second spacing, and a width of at least a partial area of a gap between the second shielding line and the second trace is a third spacing; and
the third spacing is greater than the first spacing and greater than the second spacing.

According to an aspect of the present disclosure, there is provided a display device including the touch display panel according to any one of the above embodiments.

It should be noted that the above general description and the following detailed description are merely exemplary and explanatory and should not be construed as limiting of the disclosure.

BRIEF DESCRIPTION OF THE DRAWINGS

The drawings here are incorporated into the specification and constitute a part of the specification, show embodiments in consistent with the present disclosure, and are used together with the specification to explain principles of the present disclosure. Obviously, the drawings in the following description are only some embodiments of the present disclosure. For those of ordinary skill in the art, other drawings can be obtained based on these drawings without creative work.

Figure 1:
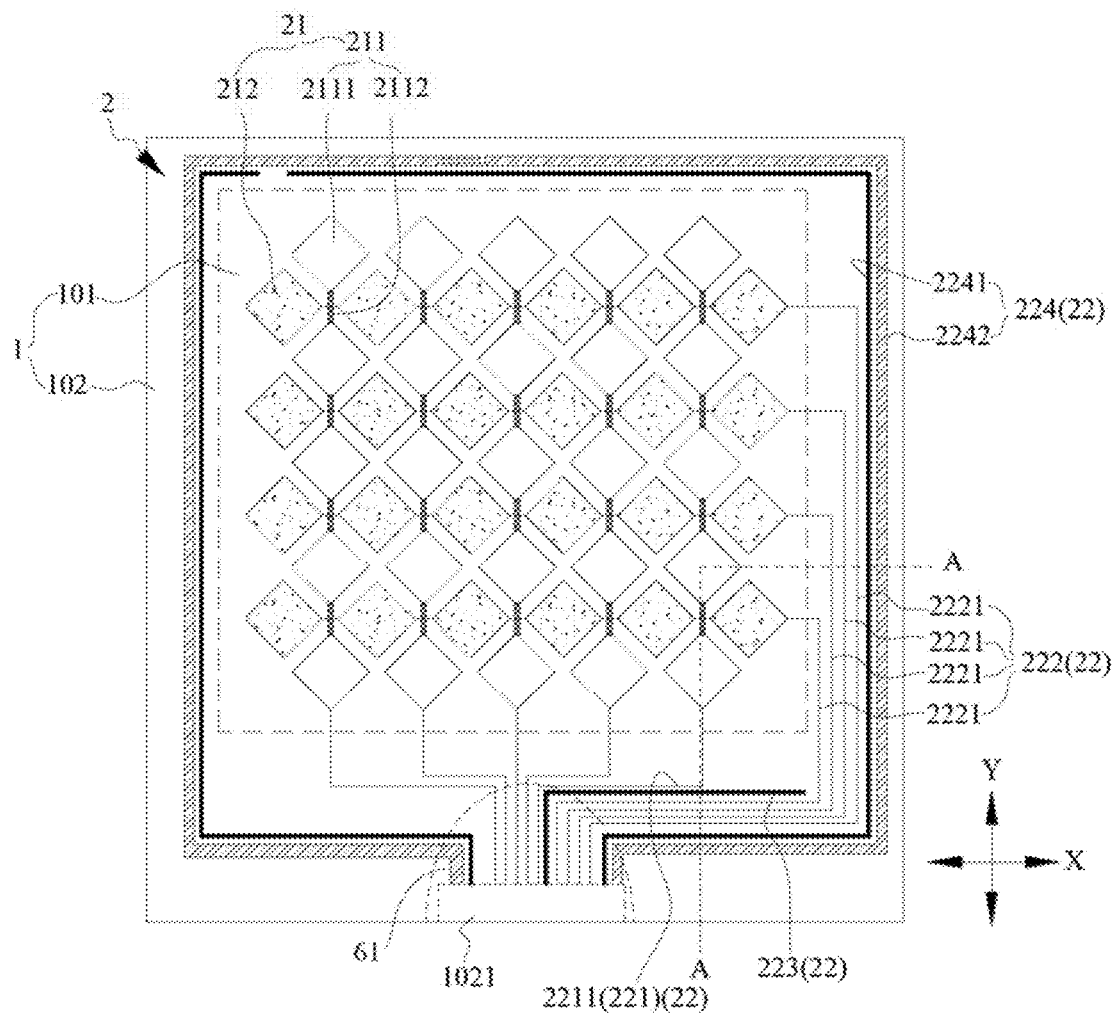
FIG. 1 is a schematic diagram of an embodiment of a touch display panel of the present disclosure.

DESCRIPTION OF REFERENCE SIGNS 1, display substrate; 101, display area; 102, peripheral area; 1021, binding area; 2, touch layer; 21, touch electrode; 211, first touch electrode; 2111, electrode unit; 2112, connection unit 212, second touch electrode; 22, peripheral trace; 221, first trace; 2211, first sub-trace; 222, second trace; 2221, second sub-trace; 223, first shielding line; 224, second shielding line; 2241, first line body; 2242, second line body; 001, conductive layer; 002, first insulating layer; 003, connection layer; 201, body portion; 202, extension portion; 3, hardened layer; 4, index matching layer; 5, second insulating layer; 6, polarizing layer; 61, opening.

DETAILED DESCRIPTION

Embodiments will now be described more fully with reference to the drawings. However, the embodiments can be implemented in a variety of forms and should not be construed as being limited to examples set forth herein; rather, these embodiments are provided so that the present disclosure will be more full and complete so as to convey the idea of the embodiments to those skilled in this art. The same reference signs in the drawings denote the same or similar structures, and the detailed description thereof will be omitted. In addition, the drawings are merely schematic representations of the present disclosure and are not necessarily drawn to scale.

The terms "one", "a", "the", "said", and "at least one" are used to indicate that there are one or more elements/components or the like; the terms "include" and "have" are used to indicate an open meaning of including and means that there may be additional elements/components/etc. in addition to the listed elements/components/etc.; and the terms "first", "second" and "third" etc. are used only as markers, and do not limit the number of objects.

A first direction and a second direction only refer to two intersecting directions. For example, the first direction and the second direction are perpendicular to each other, but it is not limited that the first direction must be a horizontal direction in the drawings, and the second direction is not limited to a longitudinal direction in the drawings. Those skilled in the art can know that, if a touch panel is rotated, actual orientations of the first direction and the second direction will change accordingly.

The embodiments of the present disclosure provide a touch panel, which can be used for a touch display panel. The touch display panel can be an Organic Light-Emitting Diode (OLED) touch display panel. Further, the OLED touch display panel can be a flexible display panel.

Figure 2:
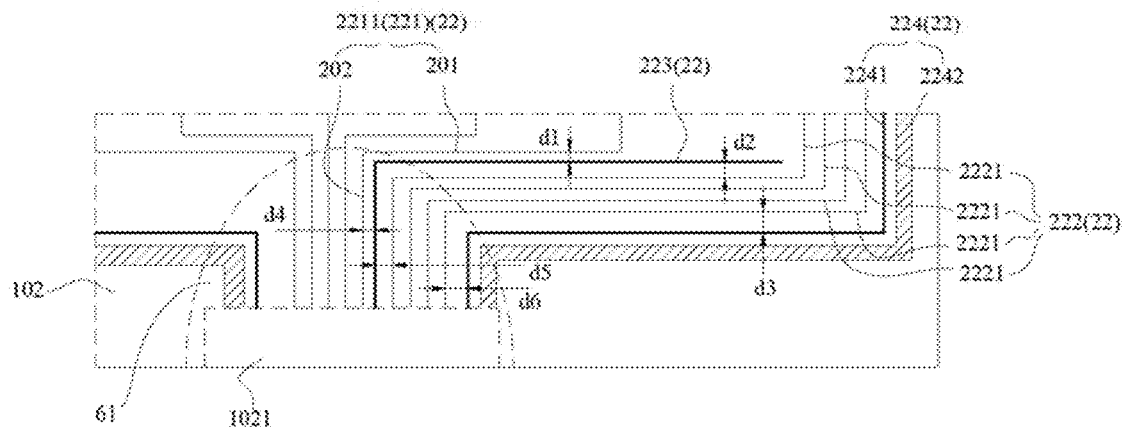
FIG. 2 is a partial schematic diagram of an embodiment of a touch panel in FIG. 1.
Figure 3:
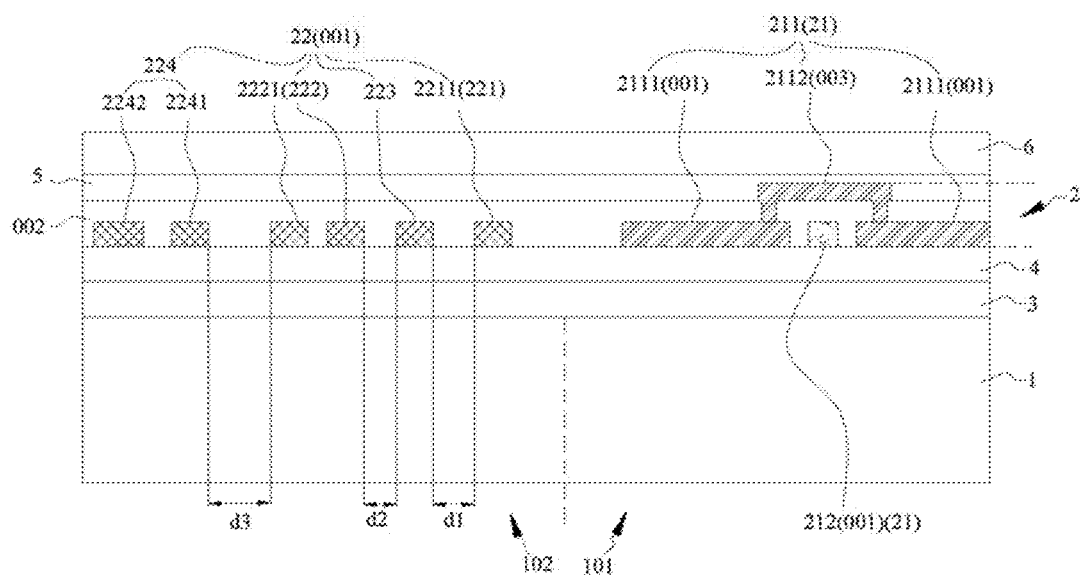
FIG. 3 is a cross-sectional view taken along a line AA in FIG. 1.

As shown in FIGS. 1-3, the touch panel according to the embodiments of the present disclosure may include a touch layer 2.

The touch layer 2 is disposed on a side of a display substrate 1, and the display substrate 1 has a display area 101 and a peripheral area 102 located outside the display area 101. The touch layer 2 includes a touch electrode 21 and a peripheral trace 22, and the touch electrode 21 is at least partially located in the display area 101, the peripheral trace 22 is located in the peripheral area 102. The touch electrode 21 includes a first touch electrode 211 and a second touch electrode 212, and the peripheral trace 22 includes a first trace 221, a second trace 222, a first shielding line 223 and a second shielding line 224. The first trace 221 is disposed outside the display area 101 and is coupled with the first touch electrode 211, the first shielding line 223 is disposed outside the first trace 221, the second trace 222 is disposed outside the first shielding line 223 and is coupled with the second touch electrode 212, and the second shielding line 224 is disposed outside the second trace 222.

A width of at least a partial area of a gap between the first shielding line 223 and the first trace 221 is a first spacing, a width of at least a partial area of a gap between the second trace 222 and the first shielding line 223 is a second spacing, and a width of at least a partial area of a gap between the second shielding line 224 and the second trace 222 is a third spacing.

The third spacing is greater than the first spacing and greater than the second spacing.

In the touch display panel according to the embodiments of the present disclosure, the first trace 221, the second trace 222, the first shielding line 223 and the second shielding line 224 are all disposed outside the display area 101 and are distributed in sequence outwards in a direction away from the display area 101, so that the second shielding line 224 is closest to an edge of the display substrate 1. In addition, the third spacing is greater than the first spacing and greater than the second spacing, that is to say, the spacing of at least the partial area of the gap between the second shielding line 224 and the second trace 222 is greater than the spacing of at least the partial area of the gap between the first shielding line 223 and the first trace 221 and greater than the spacing of at least the partial area of the gap between the first shielding line 223 and the second trace 222, so that metal electrochemical migration from the second shielding line 224 to the second trace 222 is not prone to occur, thereby reducing the risk of line failure due to the metal electrochemical migration and ensuring a normal touch function.

Each part of the touch panel according to the embodiments of the present disclosure will be described in detail below.

As shown in FIGS. 1-3, the display substrate 1 can be used to emit light to display an image, and it can be an OLED display substrate, as long as the display substrate 1 can display the image. In addition, the display substrate 1 can be at least divided into the display area 101 and the peripheral area 102 according to whether the light can be emitted. The display area 101 can emit the light for displaying the image. The peripheral area 102 is located outside the display area 101 and can surround the display area 101 for disposing the external lines, and the peripheral area 102 can be bound with an external driving circuit board.

Taking the OLED display substrate as an example, the display substrate 1 has a plurality of light emitting devices that can emit the light, and the light emitting devices are controlled to emit the light through a peripheral circuit and a pixel circuit to realize the image display. Specifically, the display substrate 1 may include a substrate, a driving circuit layer and a light emitting device layer.

The substrate may be made of a flexible material such as polyimide (PI), so as to form a flexible display substrate 1. In addition, the substrate may be made of a hard material such as glass, which is not specially limited here.

The driving circuit layer is disposed on a side of the substrate, and includes the pixel circuit and the peripheral circuit. The pixel circuit is located in the display area 101, which can be a pixel circuit such as 7T1C, 7T2C, 6T1C or 6T2C, as long as it can drive the light emitting device to emit the light. There is no special restriction on a structure of the pixel circuit here. The number of pixel circuits is the same as the number of light emitting devices, and the pixel circuits are coupled with individual light emitting devices in one-to-one correspondence, so as to control the individual light emitting devices to emit the light respectively. nTmC represents a pixel circuit includes n transistors (represented by a letter "T") and m capacitors (represented by a letter "C").

The peripheral circuit is located in the peripheral area 102, and is coupled with the pixel circuit for inputting a driving signal to the pixel circuit, so as to control the light emitting device to emit the light. The peripheral circuit may include a gate driving circuit and a light emitting control circuit. In addition, the peripheral circuit may also include other circuits, and a specific structure of the peripheral circuit is not specially limited herein.

The light emitting device layer is disposed on a surface of the driving circuit layer away from the substrate, and includes a plurality of light emitting devices distributed in an array. The light emitting device may be an OLED light emitting device. For example, each light emitting device may include a first electrode, a light emitting layer and a second electrode that are sequentially stacked along a direction away from the substrate, and the light emitting layer may include a hole injection layer, a hole transport layer, a light emitting material layer, an electron transport layer and an electron injection layer that are sequentially stacked along the direction away from the substrate. In addition, in order to facilitate the definition of a range of each light emitting device, the light emitting device layer may further include a pixel definition layer that may be disposed on the surface of the driving circuit layer away from the substrate and is provided with a plurality of via holes exposing respective first electrodes in a one-to-one correspondence. At least a partial area of each light emitting layer is disposed in each via hole, so that individual light emitting devices are defined by the via holes, and the individual light emitting devices can share the same second electrode.

In addition, the display substrate 1 may further include an encapsulation layer, which may cover a surface of the light emitting device layer away from the substrate for protecting the light emitting device. The encapsulation layer may be a multi-layer structure, for example, the encapsulation layer may include two inorganic layers and an organic layer wrapped between the inorganic layers.

As shown in FIGS. 1-3, the touch layer 2 can be disposed on the side of the display substrate 1 for sensing a touch operation. For example, the touch panel may further include a hardened layer 3 and an index matching layer 4 (that is, an INDEX MARGIN (1M) layer). The hardened layer 3 may cover the side of the display substrate 1, for example, the hardened layer 3 is disposed on a surface of the encapsulation layer away from the substrate. The index matching layer 4 can be disposed on a surface of the hardened layer 3 away from the display substrate 1. Materials of the hardened layer 3 and the index matching layer 4 may each include resin.

The touch layer 2 may include a touch electrode 21 and a peripheral trace 22. The touch electrode 21 is at least partially located in the display area 101, that is, an orthographic projection of the touch electrode 21 on the display substrate 1 is at least partially located in the display area 101. The peripheral trace 22 is located in the peripheral area 102, that is, an orthographic projection of the peripheral trace 22 on the display substrate 1 is located in the peripheral area 102, and the peripheral trace 22 surrounds the display area 101. Through the peripheral trace 22, the driving signal can be input to the touch electrode 21 and a sensing signal of the touch electrode 21 can be received, so as to determine a touch position according to the received signal and realize the touch operation.

Taking the touch layer 2 adopting a mutual capacitive touch structure as an example, as shown in FIGS. 1-3, the touch electrode 21 may include a first touch electrode 211 and a second touch electrode 212. The first touch electrode 211 and the second touch electrode 212 can be distributed in space in an intersected manner along the mutually perpendicular first and second directions, so that the touch position can be determined by sensing a capacitance change between the first touch electrode 211 and the second touch electrode 212.

As shown in FIGS. 1-3, in order to prevent the first touch electrode 211 and the second touch electrode 212 from being short-circuited, the touch layer 2 may include a conductive layer 001, a first insulating layer 002 and a connection layer 003.

The conductive layer 001 can be disposed on the side of the display substrate 1, for example, on a surface of the index matching layer 4 away from the display substrate 1. The conductive layer 001 may include an electrode area located in the display area 101 and a trace area located in the peripheral area 102. The electrode area may include a plurality of second touch electrodes 212 that may extend along the first direction and may be distributed at intervals along the second direction. In addition, the electrode area also includes a plurality of electrode unit groups, and individual electrode unit groups extend along the second direction and are distributed along the first direction. Each electrode unit group includes a plurality of electrode units 2111 distributed along the second direction, and a row of electrode units 2111 distributed along the first direction is disposed between two adjacent touch electrodes 212. A material of the electrode area may be a transparent conductive material, such as Indium Tin Oxide (ITO). For example, the first direction is shown as the X direction in FIG. 1, and the second direction is shown as the Y direction in FIG. 1.

The trace area of the conductive layer 001 is the peripheral trace 22, and a material of the trace area may be an alloy, for example, the material of the trace area may be an APC metal, which may include metallic silver, and may also include other metals such as palladium and copper. Note that, other metals may also be used in the trace area.

The first insulating layer 002 covers the conductive layer 001 and also covers the surface of the index matching layer 4 away from the display substrate 1. The first insulating layer 002 is made of a transparent insulating material, and its surface away from the display substrate 1 may be flat.

The connection layer 003 is disposed on a surface of the first insulating layer 002 away from the display substrate 1. The connection layer 003 may include a plurality of connection units 2112, and in the second direction, two adjacent electrode units 2111 are coupled by one connection unit 2112. Any first touch electrode 211 includes a column of connection units 2112 and the electrode units 2111 coupled to the connection units 2112. A material of the connection layer 003 can be the transparent conductive material, such as ITO.

It should be noted that the first touch electrodes 211 and the second touch electrodes 212 can be interchanged, that is, the first touch electrodes 211 can also extend along the second direction and can be distributed along the first direction, and the second touch electrodes 212 can also extend in the first direction and can be distributed in the second direction. FIG. 1 is only exemplary illustration without constituting a specific limitation on the directions and patterns of the first touch electrode 211 and the second touch electrode 212.

As shown in FIGS. 1-3, the peripheral trace 22 may include the first trace 221, the second trace 222, the first shielding line 223 and the second shielding line 224.

The first trace 221 is disposed outside the display area 101 and is coupled with the first touch electrode 211 for transmitting a signal to the first touch electrode 211. The first shielding line 223 is disposed outside the first trace 221, the second trace 222 is disposed outside the first shielding line 223 and is coupled with the second touch electrode 212, and the second shielding line 224 surrounds the second trace 222 outside.

The first shielding line 223 is a Guard line, and an Alternating Current (AC) signal, such as a square wave signal, can be provided to the first shielding line 223 to play a role of shielding signal interference and improving a signal-to-noise ratio. Taking the first trace 221 for transmitting the driving signal and the second trace 222 for transmitting the sensing signal as an example, there is a coupling capacitance and a potential difference between the first trace 221 and the second trace 222. Due to the existence of the coupling capacitance, there is a problem of charge escape on the first trace 221, which appears as a decrease in the signal-to-noise ratio. By setting the AC signal on the first shielding line 223, a potential difference between the first trace 221 and the first shielding line 223 can be zero, thereby preventing distortion of the driving signal due to the charge escape to cause the decrease in the signal-to-noise ratio, and playing the role of shielding interference.

The first shielding line 223 and the first trace 221 are spaced apart, and the width of at least the partial area of the gap between the first shielding line 223 and the first trace 221 is a first spacing d1. The second trace 222 and the first shielding line 223 are spaced apart, and the width of at least the partial area of the gap between the second trace 222 and the first shielding line 223 is a second spacing d2. The second shielding line 224 and the second trace 222 are spaced apart, and the width of at least the partial area of the gap between the second shielding line 224 and the second trace 222 is a third spacing d3.

Taking the material of the peripheral trace 22 as the APC metal as an example, when the electrochemical migration occurs in the peripheral trace 22, it is mainly the metallic silver that migrates. According to a silver migration theory and experimental analysis, there is a voltage between any one of the first trace 221 and the second trace 222 and any one of the first shielding line 223 and the second shielding line 224, so that the metal electrochemical migration occurs in the first shielding line 223 and the second shielding line 224. An anti-migration ability can measured $$t_{50} = \left(\alpha \frac{D}{H^x U^n}\right) \exp(\Delta H / kT)$$

where t50 is the median life (time required for 50% cumulative failure), α is a proportional constant; U is the potential difference between the second shielding line 224 and the second trace 222; D is a width of a gap between a shielding line (the first shielding line 223 or the second shielding line 224) and a trace (the first trace 221 or the second trace 222); H is a humidity factor, ΔH is an activation energy required for silver migration, and the activation energy of silver migration is 1.15±0.0.15 eV; k is the Boltzmann constant (8.617×10-5 eV/K), T is an absolute temperature (K); m, n, x are experimental index coefficients of the touch display panel, which can be determined in advance. As can be seen from above, the anti-silver migration ability is proportional to the width D of the gap between the shielding line and the trace, inversely proportional to the humidity factor H, and inversely proportional to the potential difference U between the shielding line and the trace.

According to the above analysis, since the humidity factor H is difficult to adjust directly and accurately, and the potential of the shielding line is usually fixed (grounded), a potential of an electrical signal transmitted by the trace is also substantively fixed, the potential difference U usually remains stable. Therefore, the width of the gap between the shielding line and the trace has a greater effect on the anti-silver migration ability. In addition, a distance of the second shielding line 224 from the edge of the touch display panel is shorter, and it is easier for the second shielding line 224 to contact with the outside moisture, and the humidity at a position where the second shielding line 224 is located is relatively high, the metal electrochemical migration from the second shielding line 224 to the second trace 222 easily occurs. In view of this, in the embodiments of the present disclosure, the third spacing d3 may be greater than the first spacing d1 and greater than the second spacing d2, that is, d3>d2, and d3>d1. The width of at least the partial area of the gap between the second shielding line 224 and the second trace 222 is at least to be increased, so as to weaken or prevent the occurrence of the electrochemical migration from the second shielding line 224 with a low potential (being grounded) to the second trace 222 with a high potential at least at a local area, thereby stabilizing electrical properties of the shielding line and the trace and reducing the risk of failure.

Further, as shown in FIGS. 1-3, in some embodiments of the present disclosure, when the touch display panel is in operation, the first touch electrode 211 can be used as a driving electrode, and the driving signal can be transmitted between the first touch electrode 211 and the first trace 221. The second touch electrode 212 can be used as a sensing electrode, and the sensing signal can be transmitted between the second touch electrode 212 and the second trace 222. A potential of the driving signal is higher than that of the sensing signal, so that a potential difference between the first trace 221 and the first shielding line 223 is greater than a potential difference between the second trace 222 and the first shielding line 223, and the electrochemical migration of the same line usually occurs in a direction towards the higher potential. Therefore, in order to further prevent the occurrence of the metal electrochemical migration, the first spacing d1 can be made larger than the second spacing d2 to reduce the risk of the occurrence of the metal electrochemical migration from the first shielding line 223 to the first trace 221.

Further, the third spacing d3 is less than twice the first spacing d1 and less than twice the second spacing d2, so as to avoid taking up too much space while reducing the risk of the metal electrochemical migration.

In other embodiments of the present disclosure, the first touch electrode 211 may be used as the sensing electrode, and the second touch electrode 212 may be used as the driving electrode. Based on the aforementioned principle that the first spacing d1 is greater than the second spacing d2, the second spacing d2 is made larger than the first spacing d1.

Further, as shown in FIGS. 1 and 2, in some embodiments of the present disclosure, the peripheral area 102 of the display substrate 1 may include a binding area 1021, and the touch layer 2 may be provided with a plurality of binding pads for coupling with the external driving circuit board in an area corresponding to the binding area 1021, that is to say, orthographic projections of the binding pads on the display substrate 1 are located in the binding area 1021. The peripheral trace 22 of the touch layer 2 and the peripheral circuit of the display substrate 1 are both coupled to the binding pads so as to receive and feed back signals.

The first trace 221, the second trace 222, the first shielding line 223 and the second shielding line 224 each include a body portion 201 and an extension portion 202. The body portion 201 is located in the peripheral area 102 and is located outside the binding area 1021, that is, a projection of the body portion 201 on the display substrate 1 is located in the peripheral area 102 and outside the binding area 1021. The extension portion 202 is coupled with the body portion 201 and extends into the binding area 1021. The body portion 201 may be coupled with the binding pad through the extension portion 202.

Widths of the body portion 201 and the extension portion 202 are not particularly limited herein. For example, for any trace, the width of the body portion 201 is smaller than the width of the extension portion 202 to which it is coupled. The widths of individual extension portions 202 are identical.

A width of a gap between the body portion 201 of the first shielding line 223 and the body portion 201 of the first trace 221 is the first spacing d1. A width of a gap between the body portion 201 of the second trace 222 and the body portion 201 of the first shielding line 223 is the second spacing d2. A width of a gap between the body portion 201 of the second shielding line 224 and the body portion 201 of the second trace 222 is the third spacing d3.

A width of at least a partial area of a gap between the extension portion 202 of the first shielding line 223 and the extension portion 202 of the first trace 221 is a fourth spacing d4. A width of at least a partial area of a gap between the extension portion 202 of the second trace 222 and the extension portion 202 of the first shielding line 223 is a fifth spacing d5. A width of at least a partial area of a gap between the extension portion 202 of the second shielding line 224 and the extension portion 202 of the second trace 222 is a sixth spacing d6.

Since the binding area 1021 corresponds to an opening 61, this area is easier to be in contact with moisture in the environment. A portion of the shielding line extending into the binding area 1021, that is, the extension portion 202, is prone to the metal electrochemical migration. Therefore, in some embodiments of the present disclosure, the sixth spacing d6 may be greater than the fourth spacing d4, and the sixth spacing d6 may be greater than the fifth spacing d5. The sixth spacing d6 may be greater than the third spacing d3, the fifth spacing d5 may be greater than the second spacing d2, and the fourth spacing d4 may be greater than the first spacing d1, which prevents the occurrence of the metal electrochemical migration in the second shielding line 224 and further reduces the risk of failure. Further, on the basis of d1, d2 and d3, d1, d2 and d3 can be increased by the same magnitude to obtain d4, d5 and d6, for example, d4−d1=d5−d2=d6−d3=k, where k is a real number greater than 0. Note that, d1, d2 and d3 can also be increased in equal proportions to obtain d4, d5 and d6.

Further, the fourth spacing d4 may be greater than the fifth spacing d5 to prevent the occurrence of the metal electrochemical migration in the extension portion 202 of the first shielding line 223 and reduce the risk of failure.

In other embodiments of the present disclosure, d4, d5 and d6 may also be equal.

A structure and a specific wiring node of the peripheral trace 22 are exemplarily described below.

The binding areas 1021 may be arranged in the second direction with respect to the first touch electrodes 211. The first trace 221 may include a plurality of first sub-traces 2211, the number of first sub-traces 2211 is equal to the number of first touch electrodes 211, and each of the first touch electrodes 211 is coupled to the binding area 1021 through one first sub-trace 2211, and each of the first sub-traces 2211 is located between the binding area 1021 and the display area 101. Each first sub-trace 2211 has a plurality of first line segments, including first line segments extending along the first direction and first line segments extending along the second direction.

The second trace 222 may include a plurality of second sub-traces 2221, the number of second sub-traces 2221 is equal to the number of second touch electrodes 212, and each second touch electrode 212 is coupled to the binding area 1021 through one second sub-trace 2221, and individual second sub-traces 2221 are coupled to the binding area 1021 from one side or both sides of the display area 101. Each second sub-trace 2221 has a plurality of second line segments, including second line segments extending along the first direction and second line segments extending along the second direction. In addition, the second trace 222 and the first trace 221 are disposed at intervals without intersecting with each other to avoid short circuit.

The first shielding line 223 is located between the first trace 221 and the second trace 222, one end is coupled to the binding area 1021, and the other end is a free end without being coupled to other conductors, which can be grounded through the binding area 1021. Correspondingly, the first shielding line 223 is located between a first sub-trace 2211 closest to the second trace 222 and a second sub-trace 2221 closest to the first trace 221.

The first spacing d1 is a spacing of at least a partial area of a gap between a first sub-trace 2211 adjacent to the first shielding line 223 (i.e., the first sub-trace 2211 closest to the first shielding line 223) and the first shielding line 223. The second spacing d2 is a spacing of at least a partial area of a gap between a second sub-trace 2221 adjacent to the first shielding line 223 (i.e., the second sub-trace 2221 closest to the first shielding line 223) and the first shielding line 223.

Further, a length of the first shielding line 223 in its extension direction is not smaller than a smaller one of lengths of the first sub-trace 2211 and the second sub-trace 2221 adjacent to the first shielding line 223 and is smaller than a larger one of the lengths of the first sub-trace 2211 and the second sub-trace 2221 adjacent to the first shielding line 223. For example, the length of the first shielding line 223 in its extension direction is larger than the length of the first sub-trace 2211 adjacent to it, and smaller than the length of the second sub-trace 2221 adjacent to it, so that the first sub-trace 2211 and the second sub-trace 2221 do not have areas that are not isolated by the first shielding line 223, thereby ensuring the shielding effect.

The second shielding line 224 is disposed outside the second trace 222, that is, the second shielding line 224 is located outside a second sub-trace 2221 farthest from the display area 101, and the second shielding line 224 can be disposed to surround the display area 101. The second shielding line 224 may be provided with a cutout to disconnect it, and the second shielding lines 224 on both sides of the cutout are both coupled to the binding area 1021. The second shielding line 224 may not be a closed annular structure, as long as it extends in a direction surrounding the display area 101.

Further, in some embodiments of the present disclosure, the second shielding line 224 may include a plurality of first line bodies 2241 and a plurality of second line bodies 2242 distributed in a direction away from the display area 101.

The first line bodies 2241 and the second line bodies 2242 are disposed to surround the display area 101, and each line body includes two sub-line bodies that are discontinuous. Each sub-line body has a connection end extending to the binding area 1021 and a free end opposite to the connection end, and the connection end can be coupled with the corresponding binding pad. The second line body 2242 is a GND line, which can be grounded to play a shielding role, and the first line body 2241 can be a Guard line to which the AC signal can be input. A specific working principle of the first line body 2241 is similar to that of the first shielding line 223 and will not be described in detail here.

The two sub-line bodies of the first line body 2241 are located on the same annular track, and the free ends of the two sub-line bodies are disposed oppositely at an interval on the annular track, thereby forming a disconnected cutout to make the first line body 2241 discontinuous.

The second line body 2242 can be distributed along the annular track, and can be enclosed by the first sub-line body and the second sub-line body that are discontinuous. Both the first sub-line body and the second sub-line body have the connection ends and the free ends. The connection ends of the first sub-line body and the second sub-line body extend to the binding area 1021, and the free ends of the first sub-line body and the second sub-line body extend from both sides of the binding area 1021 to a side of the display area 101 away from the binding area 1021, and are disposed in an overlapping manner; that is, the free end of the first sub-line body and the free end of the second sub-line body are sequentially distributed at an interval in a direction away from the display area 101, so that the first sub-line body and the second sub-line body are not coupled. The cutout of the first line body 2241 and an area where the first sub-line body and the second sub-line body overlap with each other are disposed in a staggered manner in the direction surrounding the display area 101.

A spacing between the first line body 2241 and the second line body 2242 is not particularly limited here, and a width of the first line body 2241 may be the same as that of the first shielding line 223, and these two widths may be smaller than a width of the second line body 2242.

The third spacing d3 is a spacing of at least a partial area of a gap between a second sub-trace 2221 adjacent to the second shielding line 224 (the second sub-trace 2221 closest to the second shielding line 224) and the second shielding line 224. Further, the third spacing d3 is a spacing of at least a partial area of a gap between the adjacent first line body 2241 and the second sub-trace 2221, that is, a spacing of at least a partial area of a gap between the first line body 2241 and the second sub wire 2221 closest to the first line body 2241. For the fourth spacing d4 to the sixth spacing d6, reference may be made to the aforementioned first spacing d1 to the third spacing d3, which will not be described in detail here.

As shown in FIG. 1 and FIG. 2, since the first shielding line 223 is only used to shield the first trace 221 and the second trace 222 that are adjacent to the first shielding line 223, that is, the first sub-trace 2211 and the second sub-trace 2221 that are adjacent to the first shielding line 223, and lengths of different first sub-traces 2211 and different second sub-traces 2221 are different, the first spacing d1 to the sixth spacing d6 may be only local spacings of the peripheral traces 22.

In other embodiments of the present disclosure, the binding area 1021 may also be arranged in the first direction with respect to the second touch electrodes 212, and for the wiring mode, reference may be made to the above-mentioned embodiments, and will not be described in detail here.

Figures 4, 5:
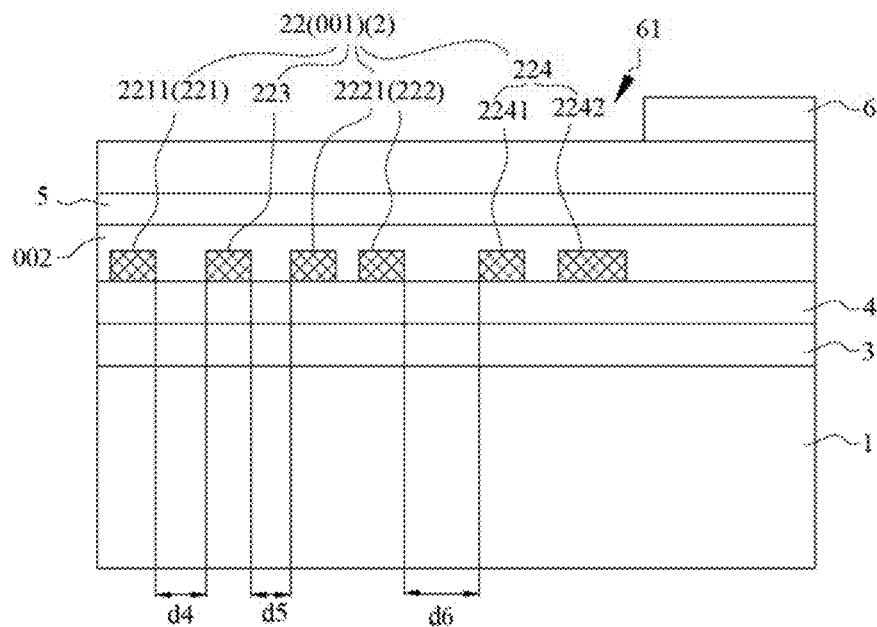
FIG. 4 is a partial cross-sectional view of an embodiment of a touch display panel of the present disclosure.
FIG. 5 is a schematic flowchart of a manufacturing method for a touch display panel according to an embodiment of the present disclosure.

As shown in FIG. 1 and FIG. 4, in some embodiments of the present disclosure, the touch panel of the present disclosure further includes a second insulating layer 5 and a polarizing layer 6.

The second insulating layer 5 covers surfaces of the connection layer 003 and the first insulating layer 002 away from the touch layer 2. A material of the second insulating layer 5 may be the same as that of the first insulating layer 002. The polarizing layer 6 can be disposed on a surface of the second insulating layer 5 away from the touch layer 2, and the polarizing layer 6 is provided with the opening 61, and the binding area 1021 is located within an orthographic projection of the opening 61 on the touch layer 2.

The embodiments of the present disclosure provide a touch display panel, as shown in FIG. 1 to FIG. 4, which may include the display substrate 1 and the touch panel of any of the above-mentioned embodiments, and the touch panel may be disposed on the side of the display substrate 1.

Specific structures of the display substrate 1 and the touch panel have been described in detail in the above touch panel embodiments, and will not be repeated here.

It should be noted that, in order to clearly show boundaries of the first spacing d1 to the sixth spacing d6, first sub-traces 2211 and second sub-traces 2221 that are not related to the first spacing ditto the sixth spacing d6 are omitted in FIGS. 3-4 without constituting a limitation on the specific numbers of the first sub-traces 2211 and the second sub-traces 2221.

The embodiments of the present disclosure further provide a manufacturing method for a touch display panel. The touch display panel may be the touch display panel in the above embodiments, and for the structure of the touch display panel, reference may be made to the touch display panel embodiments, which is not repeated here. FIG. 5 is a schematic flowchart of a manufacturing method for a touch display panel according to an embodiment of the present disclosure, and as shown in FIG. 5, the manufacturing method may include steps S110 and S120.

In the step S110, a display substrate having a display area and a peripheral area outside the display area are formed.

In the step S120, a touch layer is formed on a side of the display substrate, the touch layer includes a touch electrode and a peripheral trace, and the touch electrode is at least partially located in the display area, the peripheral trace is located in the peripheral area; the touch electrode includes a first touch electrode and a second touch electrode, and the peripheral trace includes a first trace, a second trace, a first shielding line and a second shielding line; the first trace is disposed outside the display area and is coupled with the first touch electrode, the first shielding line is disposed outside the first trace, the second trace is disposed outside the first shielding line and is coupled with the second touch electrode, and the second shielding line is disposed outside the second trace;

a width of at least a partial area of a gap between the first shielding line and the first trace is a first spacing, a width of at least a partial area of a gap between the second trace and the first shielding line is a second spacing, and a width of at least a partial area of a gap between the second shielding line and the second trace is a third spacing; and the third spacing is greater than the first spacing and greater than the second spacing.

Further, in some embodiments of the present disclosure, after the step S110 and before the step S120, the manufacturing method of the present disclosure may further include steps S130 and S140.

In the step S130, a hardened layer covering the side of the display substrate is formed.

In the step S140, an index matching layer is formed on a surface of the hardened layer away from the display substrate.

The touch layer is disposed on a surface of the index matching layer away from the display substrate.

In some embodiments of the present disclosure, the step S120 may include steps S1210 to S1230.

In the step S1210, a conductive layer is formed on the side of the display substrate; the conductive layer includes an electrode area and a trace area; the electrode area is at least partially located in the display area, and includes a plurality of second touch electrodes extending along a first direction and distributed at intervals along a second direction and a plurality of electrode unit groups extending along the second direction and distributed along the first direction, each electrode unit group includes a plurality of electrode units distributed along the second direction; the trace area is located in the peripheral area, and the trace area is the peripheral trace; and the first direction intersects the second direction.

In the step S1220, a first insulating layer covering a surface of the conductive layer away from the display substrate is formed.

In the step S1230, a connection layer is formed on a surface of the first insulating layer away from the display substrate, the connection layer includes a plurality of connection units, two adjacent electrode units are coupled through one of the connection units in the second direction, and any first touch electrode includes a column of connection units and the electrode units coupled to the connection units.

In some embodiments of the present disclosure, the manufacturing method of the present disclosure further includes steps S150 and S160.

In the step S150, a second insulating layer covering surfaces of the connection layer and the first insulating layer away from the display substrate is formed.

In the step S160, a polarizing layer is formed on a surface of the second insulating layer away from the display substrate; the polarizing layer is provided with an opening, and the binding area is located within an orthographic projection of the opening on the display substrate.

It should be noted that although various steps of the manufacturing method in the present disclosure are described in a particular order in the drawings, this is not required or implied that these steps must be performed in the particular order, or all the steps shown must be performed to achieve a desired result. Additionally or alternatively, certain steps may be omitted, multiple steps may be combined into one step for execution, and/or one step may be decomposed into multiple steps for execution, and so on.

The embodiments of the present disclosure provide a display device, and the display device may include the touch display panel of any of the above-mentioned embodiments. The touch display panel is the touch display panel of any of the above-mentioned embodiments, and for its specific structure and beneficial effects, reference can be made to the above-mentioned touch display panel embodiments, which will not be repeated here. The display device of the present disclosure may be an electronic device with a touch display function, such as a mobile phone, a tablet computer, a TV, etc., which will not be listed one by one here.

Other embodiments of the present disclosure will be apparent to those skilled in the art from consideration of the specification and practice of the present disclosure disclosed herein. The present disclosure is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. A touch panel, comprising:
    a touch layer, disposed on a side of a display substrate, wherein the display substrate has a display area and a peripheral area outside the display area;
    wherein the touch layer comprises a touch electrode and a peripheral trace, and the touch electrode is at least partially located in the display area, the peripheral trace is located in the peripheral area;
    wherein the touch electrode comprises a first touch electrode and a second touch electrode, and the peripheral trace comprises a first trace, a second trace, a first shielding line and a second shielding line;
    wherein the first trace is disposed outside the display area and is coupled with the first touch electrode, the first shielding line is disposed outside the first trace, the second trace is disposed outside the first shielding line and is coupled with the second touch electrode, and the second shielding line is disposed outside the second trace;
    wherein a width of at least a partial area of a gap between the first shielding line and the first trace is a first spacing, a width of at least a partial area of a gap between the second trace and the first shielding line is a second spacing, and a width of at least a partial area of a gap between the second shielding line and the second trace is a third spacing; and
    wherein the third spacing is greater than the first spacing and greater than the second spacing.

2. The touch panel according to claim 1, wherein the first spacing is greater than the second spacing.

3. The touch panel according to claim 1, wherein the third spacing is less than twice the first spacing and less than twice the second spacing.

4. The touch panel according to claim 1, wherein the display area comprises a binding area;
    the first trace, the second trace, the first shielding line and the second shielding line each comprise a body portion and an extension portion, and the body portion is located in the display area and located outside the binding area, the extension portion is extended into the binding area;
    a width of a gap between the first shielding line and the body portion of the first trace is the first spacing, a width of a gap between the first shielding line and the body portion of the second trace is the second spacing, and a width of a gap between the second shielding line and the body portion of the second trace is the third spacing;
    a width of at least a partial area of a gap between the first shielding line and the extension portion of the first trace is a fourth spacing, a width of at least a partial area of a gap between the first shielding line and the extension portion of the second trace is a fifth spacing, and a width of at least a partial area of a gap between the second shielding line and the extension portion of the second trace is a sixth spacing;

the sixth spacing is greater than the fourth spacing and greater than the fifth spacing; and the sixth spacing is greater than the third spacing, the fifth spacing is greater than the second spacing, and the fourth spacing is greater than the first spacing.

5. The touch panel according to claim 4, wherein the fourth spacing is greater than the fifth spacing.

6. The touch panel according to claim 4, wherein a width of any body portion is smaller than a width of an extension portion to which the body portion is coupled, and widths of individual extension portions are identical.

7. The touch panel according to claim 4, wherein the touch layer comprises:

a conductive layer, comprising an electrode area and a trace area;

a first insulating layer, wherein a surface of the conductive layer away from the display substrate is covered by the first insulating layer; and a connection layer, disposed on a surface of the first insulating layer away from the display substrate, wherein the electrode area is at least partially located in the display area, and comprises a plurality of second touch electrodes extending along a first direction and distributed at intervals along a second direction and a plurality of electrode unit groups extending along the second direction and distributed along the first direction, each electrode unit group comprises a plurality of electrode units distributed along the second direction, and the first direction is intersected with the second direction;

wherein the trace area is located in the peripheral area, and the trace area is-comprises the peripheral trace; and wherein the connection layer comprises a plurality of connection units, two adjacent electrode units are coupled through one of the connection units in the second direction, and any first touch electrode comprises a column of connection units and the electrode units coupled to the connection units.

8. The touch panel according to claim 7, wherein the touch panel further comprises:

a hardened layer, wherein the side of the display substrate is covered by the hardened layer; and an index matching layer, disposed on a surface of the hardened layer away from the display substrate, wherein the touch layer is disposed on a surface of the index matching layer away from the display substrate.

9. The touch panel according to claim 7, wherein materials of the conductive layer and the connection layer both comprise transparent conductive materials.

10. The touch panel according to claim 7, wherein a material of the peripheral trace comprises metallic silver.

11. The touch panel according to claim 7, wherein the touch panel further comprises:

a second insulating layer, wherein surfaces of the connection layer and the first insulating layer away from the display substrate are covered by the second insulating layer, and a polarizing layer, disposed on a surface of the second insulating layer away from the display substrate, wherein the polarizing layer is provided with an opening, and the binding area is located within an orthographic projection of the opening on the display substrate.

12. The touch panel according to claim 1, wherein the display area comprises a binding area;

the first trace, the second trace, the first shielding line and the second shielding line each comprise a body portion and an extension portion, and the body portion is located in the display area and located outside the binding area, the extension portion is extended into the binding area;

a width of a gap between the first shielding line and the body portion of the first trace is the first spacing, a width of a gap between the first shielding line and the body portion of the second trace is the second spacing, and a width of a gap between the second shielding line and the body portion of the second trace is the third spacing;

a width of at least a partial area of a gap between the first shielding line and the extension portion of the first trace is a fourth spacing, a width of at least a partial area of a gap between the first shielding line and the extension portion of the second trace is a fifth spacing, and a width of at least a partial area of a gap between the second shielding line and the extension portion of the second trace is a sixth spacing; and the fourth spacing, the fifth spacing and the sixth spacing are identical.

13. A touch display panel, comprising:

a display substrate, having a display area and a peripheral area outside the display area; and a touch panel, disposed on a side of the display substrate, wherein the touch panel comprises:

a touch layer, disposed on a side of a display substrate, wherein the display substrate has a display area and a peripheral area outside the display area;

wherein the touch layer comprises a touch electrode and a peripheral trace, and the touch electrode is at least partially located in the display area, the peripheral trace is located in the peripheral area;

wherein the touch electrode comprises a first touch electrode and a second touch electrode, and the peripheral trace comprises a first trace, a second trace, a first shielding line and a second shielding line;

wherein the first trace is disposed outside the display area and is coupled with the first touch electrode, the first shielding line is disposed outside the first trace, the second trace is disposed outside the first shielding line and is coupled with the second touch electrode, and the second shielding line is disposed outside the second trace;

wherein a width of at least a partial area of a gap between the first shielding line and the first trace is a first spacing, a width of at least a partial area of a gap between the second trace and the first shielding line is a second spacing, and a width of at least a partial area of a gap between the second shielding line and the second trace is a third spacing; and wherein the third spacing is greater than the first spacing and greater than the second spacing.

14. A display device, comprising the touch display panel according to claim 13.

15. The touch display panel according to claim 13, wherein the first spacing is greater than the second spacing.

16. The touch display panel according to claim 13, wherein the third spacing is less than twice the first spacing and less than twice the second spacing.

17. The touch display panel according to claim 13, wherein the display area comprises a binding area;

the first trace, the second trace, the first shielding line and the second shielding line each comprise a body portion and an extension portion, and the body portion is located in the display area and located outside the binding area, the extension portion is extended into the binding area;

a width of a gap between the first shielding line and the body portion of the first trace is the first spacing, a width of a gap between the first shielding line and the body portion of the second trace is the second spacing, and a width of a gap between the second shielding line and the body portion of the second trace is the third spacing;

a width of at least a partial area of a gap between the first shielding line and the extension portion of the first trace is a fourth spacing, a width of at least a partial area of a gap between the first shielding line and the extension portion of the second trace is a fifth spacing, and a width of at least a partial area of a gap between the second shielding line and the extension portion of the second trace is a sixth spacing;

the sixth spacing is greater than the fourth spacing and greater than the fifth spacing; and the sixth spacing is greater than the third spacing, the fifth spacing is greater than the second spacing, and the fourth spacing is greater than the first spacing.

18. The touch display panel according to claim 17, wherein the fourth spacing is greater than the fifth spacing.

19. The touch display panel according to claim 13, wherein the display area comprises a binding area;

the first trace, the second trace, the first shielding line and the second shielding line each comprise a body portion and an extension portion, and the body portion is located in the display area and located outside the binding area, the extension portion is extended into the binding area;

a width of a gap between the first shielding line and the body portion of the first trace is the first spacing, a width of a gap between the first shielding line and the body portion of the second trace is the second spacing, and a width of a gap between the second shielding line and the body portion of the second trace is the third spacing;

a width of at least a partial area of a gap between the first shielding line and the extension portion of the first trace is a fourth spacing, a width of at least a partial area of a gap between the first shielding line and the extension portion of the second trace is a fifth spacing, and a width of at least a partial area of a gap between the second shielding line and the extension portion of the second trace is a sixth spacing; and the fourth spacing, the fifth spacing and the sixth spacing are identical.

20. A manufacturing method for a touch display panel, comprising:

forming a display substrate having a display area and a peripheral area outside the display area;

forming a touch layer on a side of the display substrate, wherein the touch layer comprises a touch electrode and a peripheral trace, and the touch electrode is at least partially located in the display area, the peripheral trace is located in the peripheral area; the touch electrode comprises a first touch electrode and a second touch electrode, the peripheral trace comprises a first trace, a second trace, a first shielding line and a second shielding line; the first trace is disposed outside the display area and is coupled with the first touch electrode, the first shielding line is disposed outside the first trace, the second trace is disposed outside the first shielding line and is coupled with the second touch electrode, and the second shielding line is disposed outside the second trace;

a width of at least a partial area of a gap between the first shielding line and the first trace is a first spacing, a width of at least a partial area of a gap between the second trace and the first shielding line is a second spacing, and a width of at least a partial area of a gap between the second shielding line and the second trace is a third spacing; and the third spacing is greater than the first spacing and greater than the second spacing.

* * * * *